(12) United States Patent
Lim (10) Patent No.: US 8,373,279 B2
(45) Date of Patent: Feb. 12, 2013

(54) DIE PACKAGE

(75) Inventor: Chee Chian Lim, Alor Gajah Melaka (MY)

(73) Assignee: Infineon Technologies AG, Neubiberg (DE)

( * ) Notice: Subject to any disclaimer, the term of this patent is extended or adjusted under 35 U.S.C. 154(b) by 343 days.

(21) Appl. No.: 12/765,902

(22) Filed: Apr. 23, 2010

(65) Prior Publication Data
US 2011/0261542 A1 Oct. 27, 2011

(51) Int. Cl.
*H01L 23/48* (2006.01)
*H01L 23/52* (2006.01)

(52) U.S. Cl. ........ 257/777; 257/784; 257/787; 257/737; 257/E23.024; 257/E23.022

(58) Field of Classification Search ............... 257/784, 257/787, 737, 777, E23.024
See application file for complete search history.

(56) References Cited

U.S. PATENT DOCUMENTS

| | | | |
|---|---|---|---|
| 5,976,912 A * | 11/1999 | Fukutomi et al. | 438/110 |
| 6,001,671 A * | 12/1999 | Fjelstad | 438/112 |
| 6,198,171 B1 * | 3/2001 | Huang et al. | 257/787 |
| 6,369,448 B1 | 4/2002 | McCormick | |
| 8,106,508 B2 * | 1/2012 | Kobayakawa et al. | 257/730 |
| 8,115,285 B2 * | 2/2012 | Chen et al. | 257/676 |
| 2004/0094829 A1 * | 5/2004 | Minamio et al. | 257/676 |
| 2005/0121802 A1 | 6/2005 | Kawano et al. | |
| 2007/0052076 A1 * | 3/2007 | Ramos et al. | 257/676 |
| 2008/0173992 A1 | 7/2008 | Mahler et al. | |
| 2009/0243079 A1 * | 10/2009 | Lim et al. | 257/691 |
| 2009/0250807 A1 | 10/2009 | Lim et al. | |
| 2012/0133042 A1 * | 5/2012 | Hayashi et al. | 257/737 |

* cited by examiner

*Primary Examiner* — Nitin Parekh

(57) ABSTRACT

In an embodiment, a die package may be provided. The die package may include at least one first height adjusting structure, the at least one first height adjusting structure may include a first adjusting height relative to a common plane; at least one second height adjusting structure may be positioned adjacent to the at least one first height adjusting structure, the at least one second height adjusting structure may include a second adjusting height relative to the common plane; wherein the second adjusting height may be different from the first adjusting height relative to the common plane; a first die may be positioned on the at least one first height adjusting structure; and a mold housing substantially surrounding the at least one first height adjusting structure, the at least one second height adjusting structure and the first die.

24 Claims, 6 Drawing Sheets

DIE PACKAGE

TECHNICAL FIELD

Embodiments relate to a die package.

BACKGROUND

As electrostatic discharge (ESD) problems are encountered in a growing number of consumer electronics devices, ESD protection devices have also become readily available to offer protection from ESD. ESD is a high-voltage transient with fast rise time and fast decay time. Several thousand volts of ESD with a high rise time may break through the junction layer of protective devices easily and cause damage. ESD surge energy, however may be very small. Although ESD has tens of thousands of volts of amplitude, it lasts only several nanoseconds, and the joule rating may be almost negligible. Therefore, it may not require much energy-handling capability from a protective device.

Hence, taken as a whole, the problem of ESD may lie not in the energy handling, but in the voltage surge. Tens of thousands of volts may cause dielectric breakdown of insulation, puncture a wafer junction, or burn off a tiny trace of a microprocessor circuit. Therefore, protection devices shall be strong enough to meet high-voltage surges.

Transient Voltage Suppression (TVS) diodes, ceramic diodes and zener diodes may be used in ESD protection. TVS diodes, also known as avalanche breakdown diodes, may have several advantages in ESD suppression, such as lower clamping ratio and stronger resistance to surges, over ceramic capacitors and zener diodes.

TVS diodes may be available in small packages which may be good for use in slim handheld devices. However, an issue with the small packages may be such that the small packages may accommodate small dies but may not accommodate big, multiple or stacked dies. Because of the die limitation, ESD performance may be correspondingly limited.

Therefore, there is a need for a die package which may accommodate larger dies to obtain better ESD performance.

SUMMARY OF THE INVENTION

In various embodiments, a die package may be provided. The die package may include at least one first height adjusting structure, the at least one first height adjusting structure may include a first adjusting height relative to a common plane; at least one second height adjusting structure positioned adjacent to the at least one first height adjusting structure, the at least one second height adjusting structure may include a second adjusting height relative to the common plane, wherein the second adjusting height may be different from the first adjusting height relative to the common plane; a first die positioned on the at least one first height adjusting structure; and a mold housing substantially surrounding the at least one first height adjusting structure, the at least one second height adjusting structure and the first die.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. In this regard, directional terminology, such as "top", "bottom", "front", "back", "leading", "trailing", etc, is used with reference to the orientation of the Figure(s) being described. Because components of embodiments can be positioned in a number of different orientations, the directional terminology is used for purposes of illustration and is in no way limiting. Other embodiments may be utilized and structural, logical, and electrical changes may be made without departing from the scope of the invention. The various embodiments are not necessarily mutually exclusive, as some embodiments can be combined with one or more other embodiments to form new embodiments. The following detailed description therefore, is not to be taken in a limiting sense, and the scope of the present invention is defined by the appended claims.

The word "exemplary" is used herein to mean "serving as an example, instance, or illustration". Any embodiment or design described herein as "exemplary" is not necessarily to be construed as preferred or advantageous over other embodiments or designs.

An embodiment may provide a die package. The die package may include at least one first height adjusting structure, the at least one first height adjusting structure may include a first adjusting height relative to a common plane; at least one second height adjusting structure positioned adjacent to the at least one first height adjusting structure, the at least one second height adjusting structure may include a second adjusting height relative to the common plane, wherein the second adjusting height may be different from the first adjusting height relative to the common plane; a first die positioned on the at least one first height adjusting structure; and a mold housing substantially surrounding the at least one first height adjusting structure, the at least one second height adjusting structure and the first die.

In an embodiment, the second adjusting height may be different from the first adjusting height such that the first die may be spaced apart from the at least one second height adjusting structure when the first die may overlap with the at least one second height adjusting structure.

In an embodiment, the first adjusting height may include a value higher than the second adjusting height so that the first die may have more space to extend across the length of the mold housing or package.

In an embodiment, the at least one first height adjusting structure may include a first metallic pad; a core portion disposed over the first metallic pad; and a second metallic pad disposed over the core portion.

In an embodiment, the at least one first height adjusting structure may include the same or different structure composition as the at least one second height adjusting structure.

In an embodiment, the at least one second height adjusting structure may include a first metallic pad; a core portion disposed over the first metallic pad; and a second metallic pad disposed over the core portion.

In an embodiment, the first die may include a first front surface and a first back surface.

In an embodiment, the first back surface of the first die may be in contact with the at least one first height adjusting structure.

In an embodiment, the first front surface of the first die may be coupled to the at least one second height adjusting structure via at least one wire bond. The number of wire bond may vary depending on user and design requirements.

In an embodiment, the first back surface of the first die may be further coupled to the at least one second height adjusting structure via at least one first solder ball or bump. The number of first solder ball may vary depending on user and design requirements.

In an embodiment, the die package may further include a second die positioned between the first die and the at least one second height adjusting structure. The die package may also include more dies between the first die and the at least one second height adjusting structure depending on user and design requirements.

In an embodiment, the second die may include a second front surface and a second back surface.

In an embodiment, the die package may further include a second conductive back metal layer disposed on the second back surface of the second die. The second conductive back metal layer may include gold-tin, gold-germanium for example. The presence of the second conductive back metal layer may allow eutectic die bonding.

In an embodiment, the first back surface of the first die may be coupled to the at least one first height adjusting structure via at least one second solder ball. The number of second solder balls may vary depending on user and design requirements.

In an embodiment, the first back surface of the first die may be further coupled to the second conductive back metal layer via at least one third solder ball. The number of third solder balls may vary depending on user and design requirements.

In an embodiment, the second front surface of the second die may be coupled to the at least one second height adjusting structure via at least one fourth solder ball. The number of fourth solder balls may vary depending on user and design requirements.

In an embodiment, the die package may further include a first conductive back metal layer disposed on the first back surface of the first die. The first conductive back metal layer may include gold-tin (AuSn), gold-germanium (AuGe) for example. The presence of the first conductive back metal layer may allow eutectic die bonding.

In an embodiment, the first conductive back metal layer may be in contact with the at least one first height adjusting structure.

In an embodiment, the die package may include the first conductive back metal layer and the second conductive back metal layer for eutectic die bonding.

In an embodiment, the die package may further include a second front layer disposed on a portion of the second front surface of the second die. The second front layer may be a conductive layer or a non-conductive layer (or passivation layer). The conductive layer may include metals such as aluminium (Al), copper (Cu), gold (Au), silver (Ag), for example. The non-conductive or passivation layer may include polyamides, nitrides, phospho-silicate-glass (PSG), for example.

In an embodiment, the first conductive back metal layer may be in contact with the second front layer.

In an embodiment, the second conductive back metal layer may be in contact with the at least one second height adjusting structure.

In an embodiment, the first front surface of the first die may be coupled to the second front surface of the second die via at least one wire bond. The number of wire bonds may vary depending on user and design requirements.

In an embodiment, the first conductive back metal layer may be in further contact with the second front surface of the second die.

In an embodiment, the first back surface of the first die may be in direct contact with the second front surface of the second die.

In an embodiment, the second back surface of the second die may be coupled to the at least one second height adjusting structure via at least one fifth solder ball. The number of fifth solder balls may vary depending on user and design requirements.

In an embodiment, the at least one first height adjusting structure may be spaced apart from the at least one second height adjusting structure by a distance or spacing "s" in a range of 0.3 mm to 0.6 mm, for example about 0.5 mm.

In an embodiment, the first metallic pad may include nickel-gold (NiAu), nickel-silver (NiAg), copper (Cu), for example.

In an embodiment, the second metallic pad may include nickel-gold (NiAu), nickel-silver (NiAg), copper (Cu), for example.

In an embodiment, the first metallic pad may be of the same or different material from the second metallic pad.

In an embodiment, the core portion may include nickel (Ni), copper (Cu), for example.

In an embodiment, the first die may include a first die height "$h_{die1}$" in a range from 10 μm to 50 μm, for example about 20 μm.

In an embodiment, the second die may include a second die height "$h_{die2}$" in a range from 10 µm to 50 µm, for example about 20 µm.

In an embodiment, the first adjusting height "$h_{structure1}$" may include a value in a range from 0.1 mm to 0.5 mm, for example about 0.2 mm.

In an embodiment, the second adjusting height "$h_{structure2}$" may include a value in a range from 0.05 mm to 0.4 mm, for example about 0.1 mm.

In an embodiment, the cross-sectional dimension "$C_{die1}$" of the first die may be larger than the cross-sectional dimension of the at least one first height adjusting structure.

In an embodiment, the first die may include a cross-sectional dimension in a range from 0.1 mm to 0.9 mm, for example about 0.5 mm.

In an embodiment, the second die may include a cross-sectional dimension "$C_{die2}$" in a range from 0.1 mm to 0.9 mm, for example about 0.5 mm.

In an embodiment, the first die may be of the same or different cross-sectional dimension as the second die.

In an embodiment, the at least one first height adjusting structure "$C_{structure1}$" may include a cross-sectional dimension in a range from 0.1 mm to 0.3 mm, for example about 0.2 mm.

In an embodiment, the at least one second height adjusting structure "$C_{structure2}$" includes a cross-sectional dimension in a range from 0.1 mm to 0.3 mm, for example about 0.2 mm.

In an embodiment, the mold housing may be configured to substantially surround the at least one first height adjusting structure, the at least one second height adjusting structure and the first die such that only one first exposed surface of the at least one first height adjusting structure and one second exposed surface of the at least one second height adjusting structure may be exposed for subsequent connection.

In an embodiment, the mold housing may be configured to substantially surround the at least one first height adjusting structure, the at least one second height adjusting structure, the first die and the second die such that only one first exposed surface of the at least one first height adjusting structure and one second exposed surface of the at least one second height adjusting structure may be exposed for subsequent connection.

In an embodiment, the mold housing may include a material selected from a group consisting of plastic, ceramic, polymer.

In an embodiment, the mold housing may include a height ("H") in the range of between about 0.1 mm to about 0.5 mm, for example about 0.3 mm. The mold housing may also include a breadth ("B") in the range of between about 0.1 mm to about 0.5 mm, for example about 0.32 mm. The mold housing may further include a length ("L") in the range of between about 0.1 mm to about 0.9 mm, for example about 0.62 mm.

In an embodiment, the first die may be spaced apart from the at least one second height adjusting structure such that a portion of the first die may extend in a direction substantially parallel to the common plane from the at least one first height adjusting structure toward the at least one second height adjusting structure and the portion of the first die may be distanced from the at least one second height adjusting structure in a direction substantially perpendicular to the common plane.

In an embodiment, the at least one first solder ball may include a material selected from a group consisting of copper (Cu), tin (Sn), tin-lead (SnPb), polymer for example.

In an embodiment, the at least one first solder ball may include a diameter "$d_{solder1}$" in a range of between about 0.1 mm to about 0.3 mm, for example about 0.2 mm. The diameter may be about the vertical distance between the first die and the second height adjusting structure.

In an embodiment, the at least one first solder ball may include a shape selected from a group consisting of circle, shape, trapezium, for example.

In an embodiment, the at least one first solder ball, the at least one second solder ball, the at least one third solder ball, the at least one fourth solder ball and the at least one fifth solder ball may be of the same or different material or dimension.

In an embodiment, the mold housing may include any suitable shape depending on user and design requirements.

In an embodiment, a novel packaging design incorporating variable bump heights to enable maximum die sizes and multiple or stack dies to be accommodated in a package may be disclosed.

In an embodiment, a minimum of about 50% larger die size may be die bonded in a small leadless package.

In an embodiment, large and multiple die bonding or stack dies may be bonded in a thin leadless package.

In an embodiment, the package may allow multiple dies to be incorporated into the package.

In an embodiment, a different bump height concept may be disclosed.

In an embodiment, a largest die placement may be accommodated in a smallest thin super small leadless package (TSSLP) and other leadless lead count package for package performance enhancement.

In an embodiment, the first die or the second die may be relatively thick so as to minimize die crack due to more than about ⅓ die over hang.

In an embodiment, the first die or the second die or a die may be understood as a block of semiconducting material, on which a given functional electronic circuit is fabricated. Integrated circuits may be produced on a single wafer through processes such as photolithography. The wafer may be cut ("diced") into many pieces, each containing one or more of the circuits. Each of these pieces may be referred to as a die. The first die or the second die may be taken to include circuitry of any sort incorporating any electronic device known in the field such as capacitors, diodes, resistors or transistors, and is applicable for any type of integrated circuit die such as memory, microcontroller or microprocessor dies.

In an embodiment, the first die or the second die may also include an integrated circuit die incorporating an ESD protection device, e.g. transient voltage suppressor diodes, for dissipating electrostatic discharges. As an example, the first die or second die may include at least one active circuit. The active circuit may be part of an ESD protection device. The ESD protection device may contain P/N junctions having a sufficient area to safely dissipate electrostatic discharges. The ESD protection device may also include a diode. In an embodiment, the wafer may be made of semiconductor materials of various types, including silicon, germanium, Group III to V or other types, including polymers, for example, although in another embodiment of the invention, other suitable materials can also be used. In an exemplary embodiment of the invention, the wafer may be made of silicon (doped or undoped), in an alternative embodiment of the invention, the wafer may be a silicon on insulator (SOI) wafer. As an alternative, any other suitable semiconductor materials can be used for the wafer, for example semiconductor compound material such as gallium arsenide (GaAs), indium phosphide (InP), but also any suitable ternary semiconductor compound material or quaternary semiconductor compound material such as indium gallium arsenide (InGaAs).

In an embodiment, the first die or second die may include a graphene transistor. The graphene transistor may be formed by heating a wafer of silicon carbide to create a surface layer of carbon atoms in the form of grapheme. Parallel source and drain electrodes may be deposited on the graphene, leaving channels of exposed graphene between them. Then an insulating layer may be deposited onto the exposed graphene without affecting its electronic properties.

In an embodiment, the die package may be fabricated by masking technology or any other suitable technology in order to accommodate the different heights of the first height adjusting structure and the second height adjusting structure.

Figure 1A:
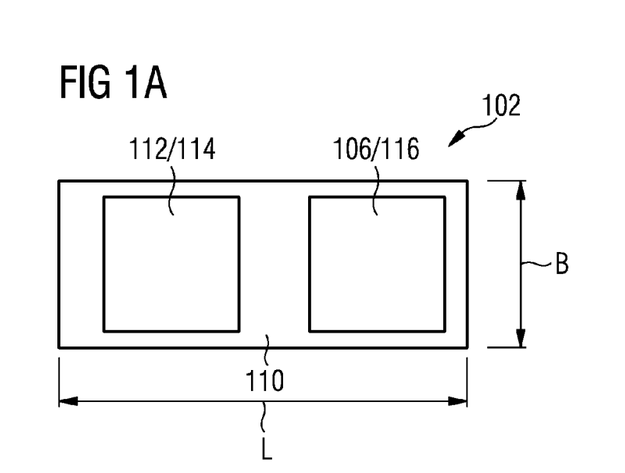
FIG. 1A shows a bottom view of a die package including a first die coupled to one second height adjusting structure via a wire bond according to an embodiment.

FIG. 1A shows a bottom view of a die package 102 including a first die (not shown) coupled to one second height adjusting structure 106 via a wire bond (not shown) according to an embodiment.

FIG. 1A shows the die package 102 including a mold housing 110, a first exposed surface 112 of a first height adjusting structure 114 and a second exposed surface 116 of the second height adjusting structure 106.

The mold housing 110 may include a breadth "B" in the range of between about 0.1 mm to about 0.5 mm, for example about 0.32 mm. The mold housing 110 may further include a length "L" in the range of between about 0.1 mm to about 0.9 mm, for example about 0.62 mm.

Figure 1B:
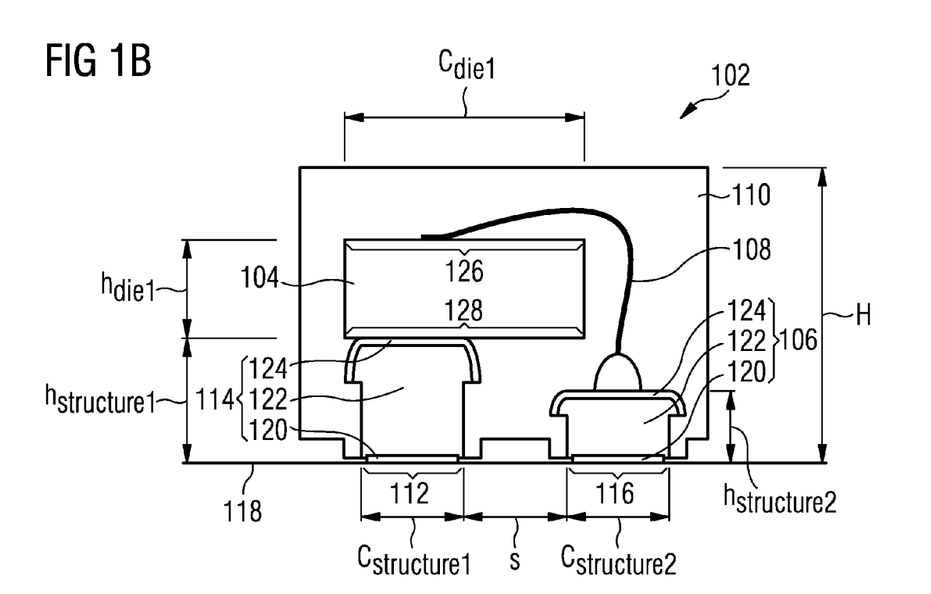
FIG. 1B shows a side view of the die package of FIG. 1A according to an embodiment.

FIG. 1B shows a side view of the die package 102 of FIG. 1A according to an embodiment.

In FIG. 1B, the die package 102 may include a first height adjusting structure 114, the first height adjusting structure 114 may include a first adjusting height "$h_{structure1}$" relative to a common plane 118. The die package 102 may include a second height adjusting structure 106 positioned adjacent to the first height adjusting structure 114, the second height adjusting structure 106 may include a second adjusting height "$h_{structure2}$" relative to the common plane 118, wherein the second adjusting height may be different from the first adjusting height relative to the common plane 118. The die package 102 may further include a first die 104 (in this embodiment the only die 104 in the die package 102) positioned on the first height adjusting structure 114 and a mold housing 110 substantially surrounding the first height adjusting structure 114, the second height adjusting structure 106 and the first die 104. As an example, the first die 104 may be positioned or attached onto the first height adjusting structure 114 by eutectic bonding, epoxy bonding or tape bonding.

The second adjusting height may be different from the first adjusting height such that the first die 104 may be spaced apart from the second height adjusting structure 106 when the first die 104 may overlap with the second height adjusting structure 106. The first adjusting height may include a value higher than the second adjusting height.

The first height adjusting structure 114 may include a first metallic pad 120, a core portion 122 disposed over the first metallic pad 120 and a second metallic pad 124 disposed over the core portion 122.

The first height adjusting structure 114 may include the same or different structure composition as the second height adjusting structure 106. Therefore, the second height adjusting structure 106 may also include the first metallic pad 120, the core portion 122 disposed over the first metallic pad 120 and the second metallic pad 124 disposed over the core portion 122.

The first die 104 may include a first front surface 126 and a first back surface 128. The first back surface 128 of the first die 104 may be in contact with the first height adjusting structure 114. The first front surface 126 of the first die 104 may be coupled to the second height adjusting structure 106 via a wire bond 108.

The first height adjusting structure 114 may be spaced apart from the second height adjusting structure 106 by a distance or spacing "s" in a range of 0.3 mm to 0.6 mm, for example about 0.5 mm.

The first metallic pad 120 may include NiAu, NiAg, Cu for example. The second metallic pad 124 may include NiAu, NiAg, Cu for example. The first metallic pad 120 may be of the same or different material from the second metallic pad 124. The core portion 122 may include Ni, Cu for example.

The first die 104 may include a first die 104 height "$h_{die1}$" in a range from 10 μm to 50 μm, for example about 20 μm. The first adjusting height "$h_{structure1}$" may include a value in a range from 0.1 mm to 0.5 mm, for example about 0.2 mm. The second adjusting height "$h_{structure2}$" may include a value in a range from 0.05 mm to 0.4 mm, for example about 0.1 mm.

The cross-sectional dimension "$C_{die1}$" of the first die 104 may be larger than the cross-sectional dimension "$C_{structure1}$" of the first height adjusting structure 114. The first die 104 may include a cross-sectional dimension in a range from 0.1 mm to 0.9 mm, for example about 0.5 mm. The first height adjusting structure 114 may include a cross-sectional dimension in a range from 0.1 mm to 0.3 mm, for example about 0.2 mm. The second height adjusting structure 106 includes a cross-sectional dimension "$C_{structure2}$" in a range from 0.1 mm to 0.3 mm, for example about 0.2 mm.

The mold housing 110 may be configured to substantially surround the first height adjusting structure 114, the second height adjusting structure 106 and the first die 104 such that only one first exposed surface 112 of the first height adjusting structure 114 and one second exposed surface 116 of the second height adjusting structure 106 may be exposed for subsequent connection. The mold housing 110 may include a material selected from a group consisting of plastic, ceramic, polymer for example. The mold housing 110 may include a height "H" in the range of between about 0.1 mm to about 0.5 mm, for example about 0.3 mm.

The first die 104 may be spaced apart from the second height adjusting structure 106 such that a portion of the first die 104 may extend in a direction substantially parallel to the common plane 118 from the first height adjusting structure 114 toward the second height adjusting structure 106 and the portion of the first die 104 may be distanced from the second height adjusting structure 106 in a direction substantially perpendicular to the common plane 118.

Figure 2A:
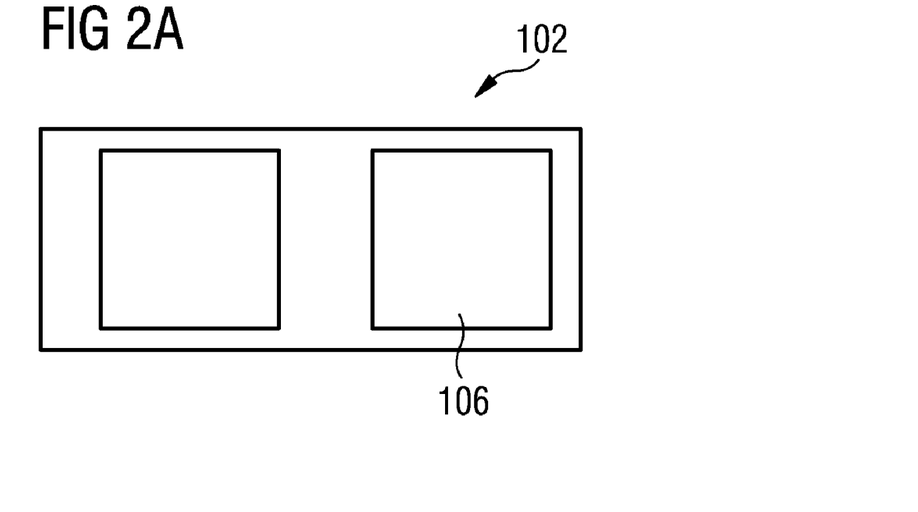
FIG. 2A shows a bottom view of a die package including a first die coupled to one second height adjusting structure via a first solder ball according to an embodiment.

FIG. 2A shows a bottom view of a die package 102 including a first die (not shown) coupled to one second height adjusting structure 106 via a first solder ball (not shown) according to an embodiment.

The bottom view of the die package 102 as shown in FIG. 2A may be similar to the bottom view of the die package 102 as shown in FIG. 1A.

Figure 2B:
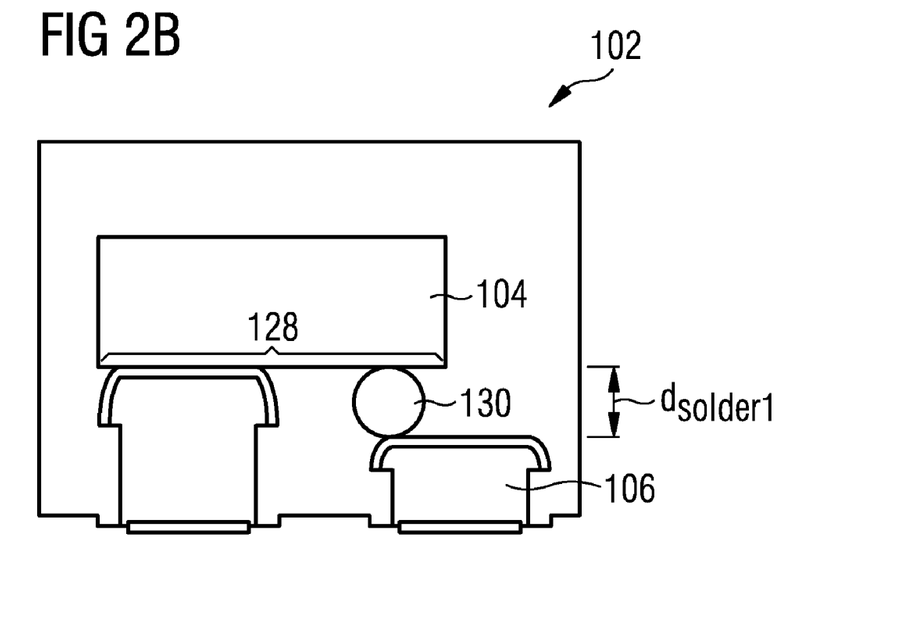
FIG. 2B shows a side view of the die package of FIG. 2A according to an embodiment.

FIG. 2B shows a side view of the die package 102 of FIG. 2A according to an embodiment.

The die package 102 as shown in FIG. 2B may be similar to the die package 102 as shown in FIG. 1B with the difference such that in FIG. 2B, the first back surface 128 of the first die 104 may be further coupled to the second height adjusting structure 106 via a first solder ball 130 while in FIG. 1B, the first front surface 126 of the first die 104 may be coupled to the second height adjusting structure 106 via a wire bond 108.

In an embodiment, the first solder ball 130 may include a material selected from a group consisting of Cu, Sn, SnPb, polymer for example. The first solder ball 130 may include a diameter "$d_{solder1}$" in a range of between about 0.1 mm to about 0.3 mm, for example about 0.2 mm. The first solder ball 130 may include a shape selected from a group consisting of circle, shape, trapezium, for example.

Figure 3A:
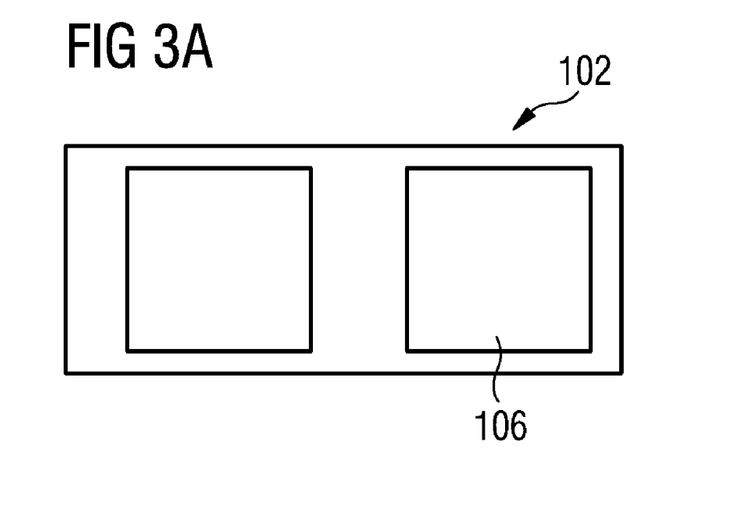
FIG. 3A shows a bottom view of a die package including a first die coupled to one second height adjusting structure via a combination of a third solder ball, a second conductive back metal layer, a second die and a fourth solder ball according to an embodiment.

FIG. 3A shows a bottom view of a die package 102 including a first die (not shown) coupled to one second height adjusting structure 106 via a combination of a third solder ball (not shown), a second conductive back metal layer (not shown), a second die (not shown) and a fourth solder ball (not shown) according to an embodiment.

The bottom view of the die package 102 as shown in FIG. 3A may be similar to the bottom view of the respective die packages 102 as shown in FIG. 1A and FIG. 2A.

Figure 3B:
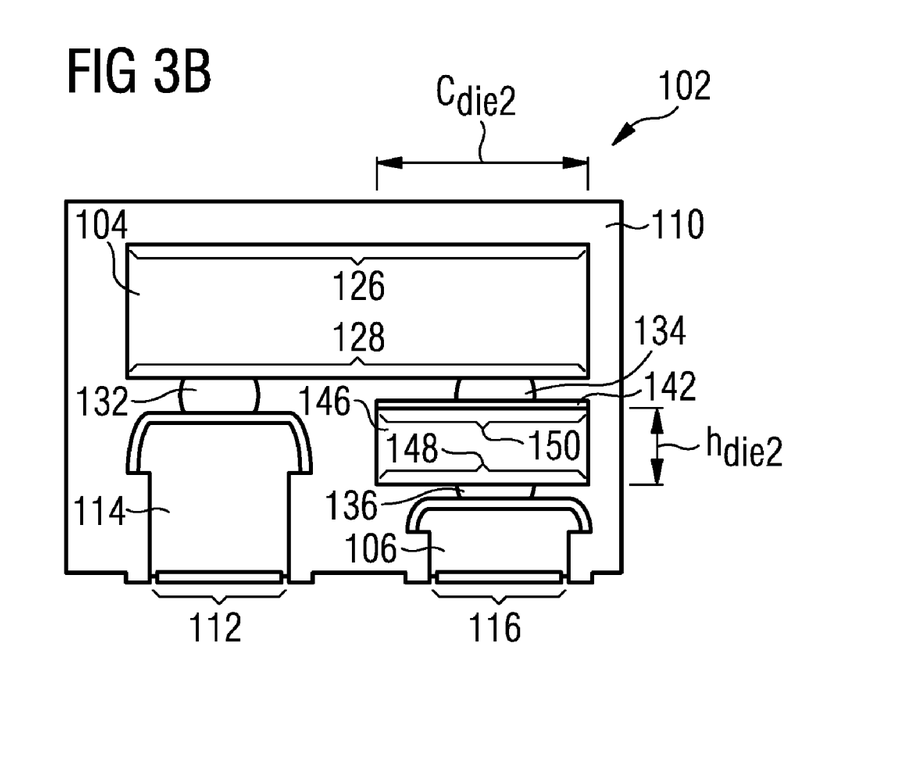
FIG. 3B shows a side view of the die package of FIG. 3A according to an embodiment.

FIG. 3B shows a side view of the die package 102 of FIG. 3A according to an embodiment.

The die package 102 as shown in FIG. 3B may be similar to the die package 102 as shown in FIG. 2B with the difference such that in FIG. 3B, the first back surface 128 of the first die 104 may be coupled to the second height adjusting structure 106 via the combination of the third solder ball 134, the second conductive back metal layer 142, the second die 146 and the fourth solder ball 136 while in FIG. 2B, the first back surface 128 of the first die 104 may be coupled to the second height adjusting structure 106 via a first solder ball 130.

In FIG. 3B, the die package 102 may include a first height adjusting structure 114, the first height adjusting structure 114 may include a first adjusting height relative to a common plane (not shown). The die package 102 may include a second height adjusting structure 106 positioned adjacent to the first height adjusting structure 114, the second height adjusting structure 106 may include a second adjusting height relative to the common plane (not shown), wherein the second adjusting height may be different from the first adjusting height relative to the common plane (not shown). The die package 102 may further include a first die 104 positioned on the first height adjusting structure 114 and a mold housing 110 substantially surrounding the first height adjusting structure 114, the second height adjusting structure 106 and the first die 104.

The second adjusting height may be different from the first adjusting height such that the first die 104 may be spaced apart from the second height adjusting structure 106 when the first die 104 may overlap with the second height adjusting structure 106. The first adjusting height may include a value higher than the second adjusting height.

The first die 104 may include a first front surface 126 and a first back surface 128.

The die package 102 may further include a second die 146 positioned between the first die 104 and the second height adjusting structure 106. The second die 146 may include a second front surface 148 and a second back surface 150.

The die package 102 may further include a second conductive back metal layer 142 disposed on the second back surface 150 of the second die 146.

The first back surface 128 of the first die 104 may be coupled to the first height adjusting structure 114 via a second solder ball 132.

The first back surface 128 of the first die 104 may be further coupled to the second conductive back metal layer 142 via the third solder ball 134. The second front surface 148 of the second die 146 may be coupled to the second height adjusting structure 106 via the fourth solder ball 136.

The second die 146 may include a second die 146 height "$h_{die2}$" in a range from 10 μm to 50 μm, for example about 20 μm. The second die 146 may include a cross-sectional dimension "$C_{die2}$" in a range from 0.1 mm to 0.9 mm, for example about 0.5 mm.

The mold housing 110 may be configured to substantially surround the first height adjusting structure 114, the second height adjusting structure 106, the first die 104 and the second die 146 such that only one first exposed surface 112 of the first height adjusting structure 114 and one second exposed surface 116 of the second height adjusting structure 106 may be exposed for subsequent connection.

In an embodiment, each of the second solder ball 132, the third solder ball 134 and the fourth solder ball 136 may include a material selected from a group consisting of Cu, Sn, SnPb, polymer for example.

Each of the second solder ball 132, the third solder ball 134 and the fourth solder ball 136 may include a diameter in a range of between about 0.1 mm to about 0.3 mm, for example about 0.2 mm. Each of the second solder ball 132, the third solder ball 134 and the fourth solder ball 136 may include a shape selected from a group consisting of circle, shape, trapezium, for example. The second solder ball 132, the third solder ball 134 and the fourth solder ball 136 may be of the same or different material or dimension.

Figure 4A:
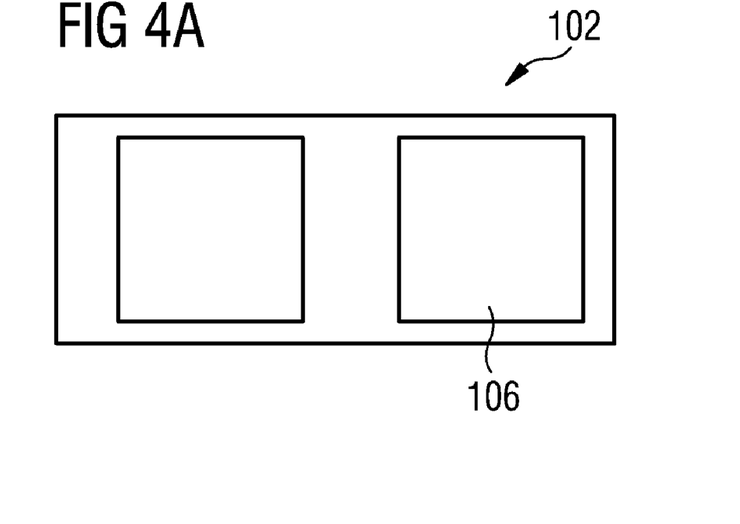
FIG. 4A shows a bottom view of a die package including a first die coupled to one second height adjusting structure via a combination of a first conductive back metal layer, a second front layer, a second die and a second conductive back metal layer according to an embodiment.

FIG. 4A shows a bottom view of a die package 102 including a first die (not shown) coupled to one second height adjusting structure 106 via a combination of a first conductive back metal layer (not shown), a second front layer (not shown), a second die (not shown) and a second conductive back metal layer (not shown) according to an embodiment.

The bottom view of the die package 102 as shown in FIG. 4A may be similar to the bottom view of the respective die packages 102 as shown in FIG. 1A, FIG. 2A and FIG. 3A.

Figure 4B:
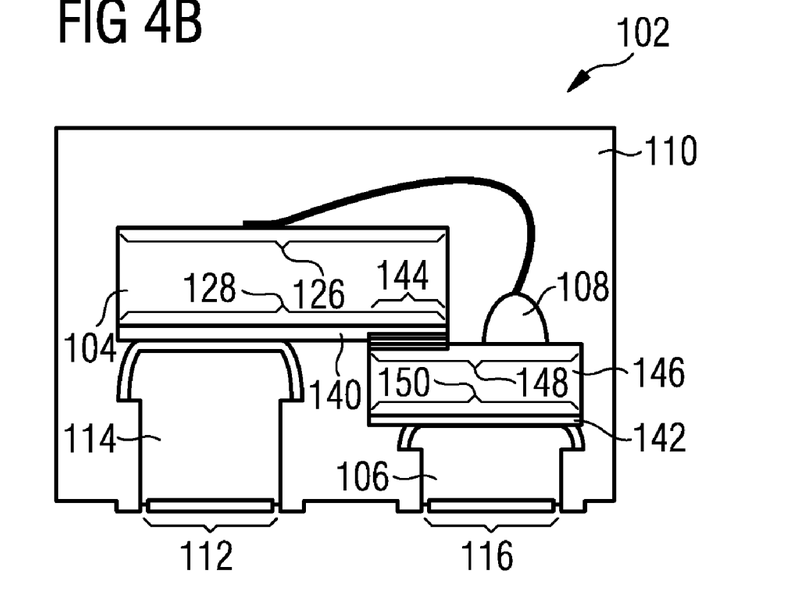
FIG. 4B shows a side view of the die package of FIG. 4A according to an embodiment.

FIG. 4B shows a side view of the die package 102 of FIG. 4A according to an embodiment.

The die package 102 as shown in FIG. 4B may be similar to the die package 102 as shown in FIG. 3B with the difference such that in FIG. 4B, the first back surface 128 of the first die 104 may be coupled to the second height adjusting structure 106 via the combination of the first conductive back metal layer 140, the second front layer 144, the second die 146 and the second conductive back metal layer 142 while in FIG. 3B, the first back surface 128 of the first die 104 may be coupled to the second height adjusting structure 106 via a combination of a third solder ball 134, a second conductive back metal layer 142, a second die 146 and a fourth solder ball 136.

In FIG. 4B, the die package 102 may include a first height adjusting structure 114, the first height adjusting structure 114 may include a first adjusting height relative to a common plane (not shown). The die package 102 may further include a second height adjusting structure 106 positioned adjacent to the first height adjusting structure 114, the second height adjusting structure 106 may include a second adjusting height relative to the common plane (not shown), wherein the second adjusting height may be different from the first adjusting height relative to the common plane (not shown). The die package 102 may further include a first die 104 positioned on the first height adjusting structure 114 and a mold housing 110 substantially surrounding the first height adjusting structure 114, the second height adjusting structure 106 and the first die 104.

The second adjusting height may be different from the first adjusting height such that the first die 104 may be spaced apart from the second height adjusting structure 106 when the first die 104 may overlap with the second height adjusting structure 106. The first adjusting height may include a value higher than the second adjusting height.

The first die 104 may include a first front surface 126 and a first back surface 128.

The die package 102 may further include a second die 146 positioned between the first die 104 and the second height adjusting structure 106. The second die 146 may include a second front surface 148 and a second back surface 150.

The die package 102 may further include the second conductive back metal layer 142 disposed on the second back surface 150 of the second die 146.

The die package 102 may further include the first conductive back metal layer 140 disposed on the first back surface 128 of the first die 104. The first conductive back metal layer 140 may be in contact with the first height adjusting structure 114.

The die package 102 may further include the second front layer 144 disposed on a portion of the second front surface 148 of the second die 146. The first conductive back metal layer 140 may be in contact with the second front layer 144. The second conductive back metal layer 142 may be in contact with the second height adjusting structure 106.

The first front surface 126 of the first die 104 may be coupled to the second front surface 148 of the second die 146 via a wire bond 108.

The mold housing 110 may be configured to substantially surround the first height adjusting structure 114, the second height adjusting structure 106, the first die 104 and the second die 146 such that only one first exposed surface 112 of the first height adjusting structure 114 and one second exposed surface 116 of the second height adjusting structure 106 may be exposed for subsequent connection.

Figure 5A:
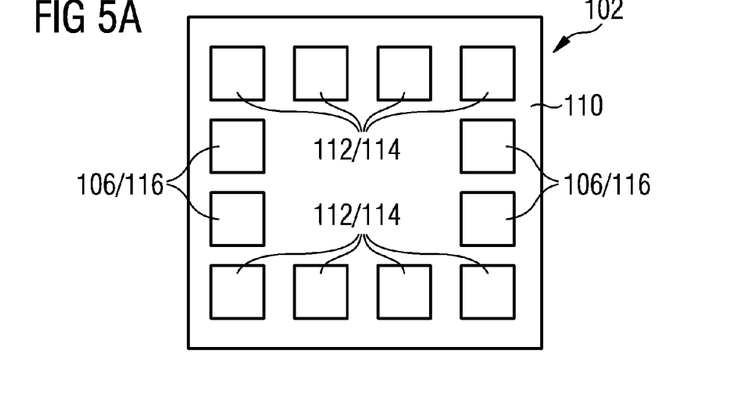
FIG. 5A shows a bottom view of a die package including a first die coupled to a plurality of second height adjusting structures via a combination of a second die, a first conductive back metal layer and a second conductive back metal layer according to an embodiment.

FIG. 5A shows a bottom view of a die package 102 including a first die (not shown) coupled to a plurality of second height adjusting structures 106 via a combination of a second die (not shown), a first conductive back metal layer (not shown) and a second conductive back metal layer (not shown) according to an embodiment.

FIG. 5A shows the die package 102 including a mold housing 110, a plurality of first exposed surfaces 112 of the respective first height adjusting structures 114 and a plurality of second exposed surfaces 116 of the respective second height adjusting structures 106. FIG. 5A shows a foot print for printed circuit board (PCB) soldering.

Figure 5B:
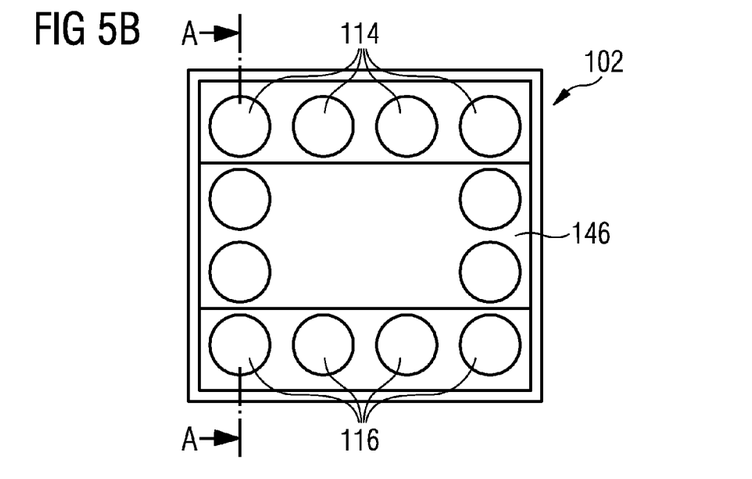
FIG. 5B shows a top view of the die package of FIG. 5A according to an embodiment.

FIG. 5B shows a top view of the die package 102 of FIG. 5A according to an embodiment.

FIG. 5B shows the die package 102 including a first die 104, a second die 146, a plurality of first height adjusting structures 114 and a plurality of second height adjusting structures 106.

Figure 5C:
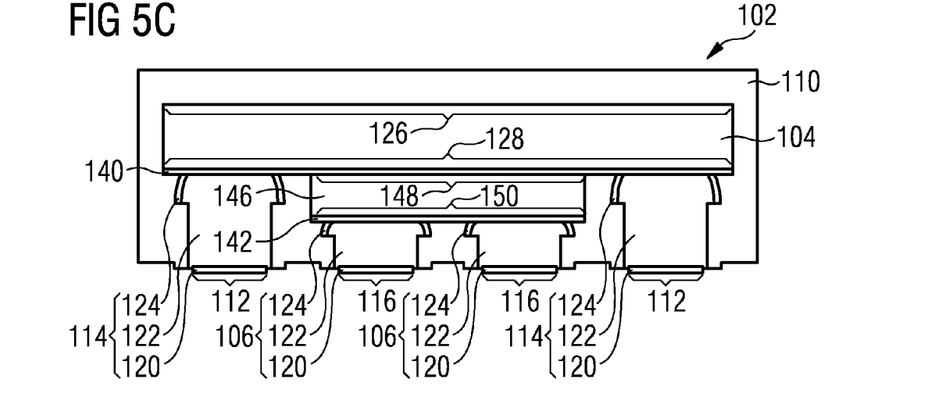
FIG. 5C shows a cross-sectional view along A-A of the die package of FIG. 5B according to an embodiment.

FIG. 5C shows a cross-sectional view along A-A of the die package 102 of FIG. 5B according to an embodiment.

In FIG. 5C, the die package 102 may include a plurality of first height adjusting structures 114, each of the plurality of first height adjusting structures 114 may include a first adjusting height relative to a common plane (not shown). The die package 102 may include a plurality of second height adjusting structures 106 positioned adjacent to the plurality of first height adjusting structures 114, each of the plurality of second height adjusting structures 106 may include a second adjusting height relative to the common plane (not shown), wherein the second adjusting height may be different from the first adjusting height relative to the common plane (not shown). The die package 102 may further include a first die 104 positioned on the plurality of first height adjusting structures 114 and a mold housing 110 substantially surrounding the plurality of first height adjusting structures 114, the plurality of second height adjusting structures 106 and the first die 104.

The second adjusting height may be different from the first adjusting height such that the first die 104 may be spaced apart from each of the plurality of second height adjusting structures 106 when the first die 104 may overlap with each of the plurality of second height adjusting structures 106. The first adjusting height may include a value higher than the second adjusting height.

Each of the plurality of first height adjusting structures 114 may include a first metallic pad 120, a core portion 122 disposed over the first metallic pad 120 and a second metallic pad 124 disposed over the core portion 122.

Each of the plurality of first height adjusting structures 114 may include the same or different structure composition as each of the plurality of second height adjusting structures 106. As an example, each of the second height adjusting structures 106 may also include the first metallic pad 120, the core portion 122 disposed over the first metallic pad 120 and the second metallic pad 124 disposed over the core portion 122.

The first die 104 may include a first front surface 126 and a first back surface 128.

The die package 102 may further include a second die 146 positioned between the first die 104 and each of the plurality of second height adjusting structures 106. The second die 146 may include a second front surface 148 and a second back surface 150. As an example, the first die 104 may be attached to the second die 146 by any suitable bonding techniques, for example eutectic bonding, epoxy bonding or tape bonding.

The die package 102 may further include a first conductive back metal layer 140 disposed on the first back surface 128 of the first die 104. The die package 102 may further include a second conductive back metal layer 142 disposed on the second back surface 150 of the second die 146.

The first conductive back metal layer 140 may be in contact with each of the plurality of first height adjusting structures 114. The first conductive back metal layer 140 may be in further contact with the second front surface 148 of the second die 146.

The second conductive back metal layer 142 may be in contact with each of the plurality of second height adjusting structures 106.

The mold housing 110 may be configured to substantially surround the plurality of first height adjusting structures 114, the plurality of second height adjusting structures 106, the first die 104 and the second die 146 such that only one first exposed surface 112 of each of the plurality of first height adjusting structures 114 and one second exposed surface 116 of each of the plurality of second height adjusting structures 106 may be exposed for subsequent connection.

Figure 6A:
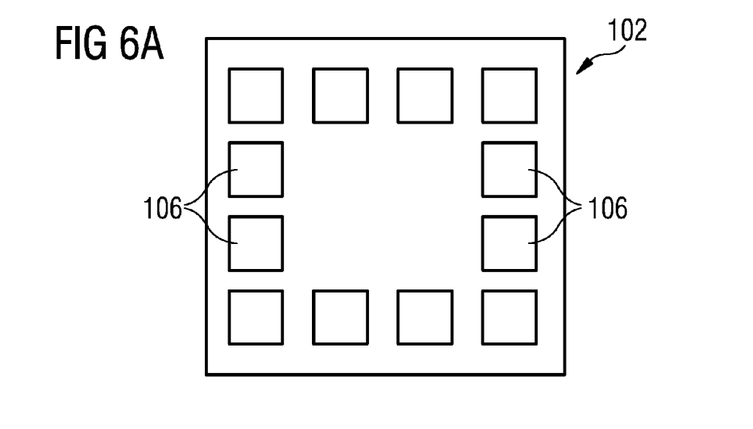
FIG. 6A shows a bottom view of a die package including a first die coupled to a plurality of second height adjusting structures via a combination of a second die and a plurality of fifth solder balls according to an embodiment.

FIG. 6A shows a bottom view of a die package 102 including a first die (not shown) coupled to a plurality of second height adjusting structures 106 via a combination of a second die (not shown) and a plurality of fifth solder balls (not shown) according to an embodiment.

The bottom view of the die package 102 as shown in FIG. 6A may be similar to the bottom view of the die package 102 as shown in FIG. 5A. FIG. 6A shows a foot print for printed circuit board (PCB) soldering.

Figure 6B:
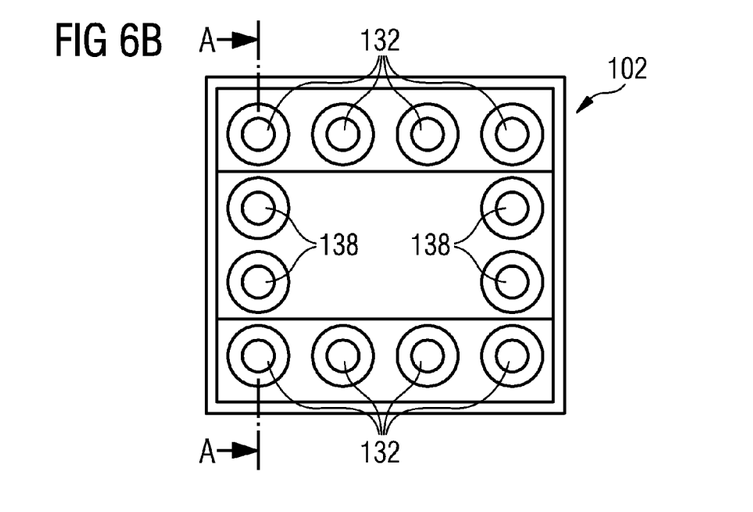
FIG. 6B shows a top view of the die package of FIG. 6A according to an embodiment.

FIG. 6B shows a top view of the die package 102 of FIG. 6A according to an embodiment.

The top view of the die package 102 as shown in FIG. 6A may be seen to be similar to the bottom view of the die package 102 as shown in FIG. 5A with the addition of the plurality of second solder balls 132 and fifth solder balls 138.

Figure 6C:
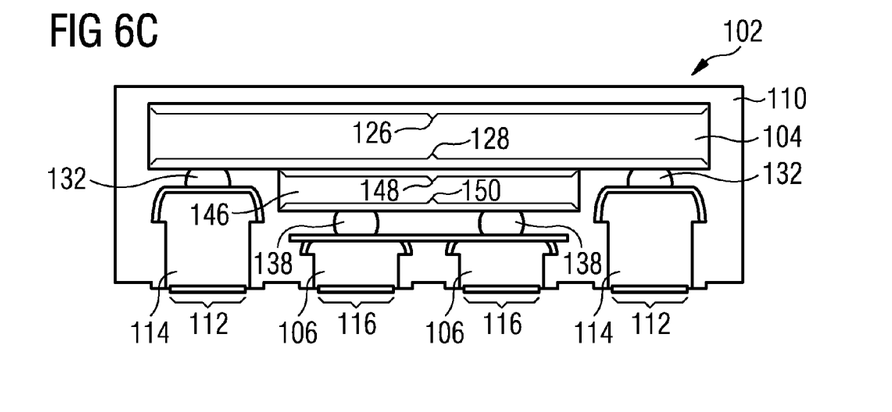
FIG. 6C shows a cross-sectional view along A-A of the die package of FIG. 6B according to an embodiment.

FIG. 6C shows a cross-sectional view along A-A of the die package 102 of FIG. 6B according to an embodiment.

In FIG. 6C, the die package 102 may include a plurality of first height adjusting structures 114, each of the plurality of first height adjusting structures 114 may include a first adjusting height relative to a common plane (not shown). The die package 102 may include a plurality of second height adjusting structures 106 positioned adjacent to the plurality of first height adjusting structures 114, each of the plurality of second height adjusting structures 106 may include a second adjusting height relative to the common plane (not shown), wherein the second adjusting height may be different from the first adjusting height relative to the common plane (not shown). The die package 102 may include a first die 104 positioned on the plurality of first height adjusting structures 114 and a mold housing 110 substantially surrounding the plurality of first height adjusting structures 114, the plurality of second height adjusting structures 106 and the first die 104.

The second adjusting height may be different from the first adjusting height such that the first die 104 may be spaced apart from each of plurality of second height adjusting structures 106 when the first die 104 may overlap with each of the plurality of second height adjusting structures 106. The first adjusting height may include a value higher than the second adjusting height.

The first die 104 may include a first front surface 126 and a first back surface 128.

The die package 102 may further include a second die 146 positioned between the first die 104 and the plurality of second height adjusting structures 106. The second die 146 may include a second front surface 148 and a second back surface 150.

The first back surface 128 of the first die 104 may be coupled to each of the plurality of first height adjusting structures 114 via respective second solder balls 132. The first back surface 128 of the first die 104 may be in direct contact with the second front surface 148 of the second die 146.

The second back surface 150 of the second die 146 may be coupled to each of the plurality of second height adjusting structures 106 via respective fifth solder balls 138.

The mold housing 110 may be configured to substantially surround the plurality of first height adjusting structures 114, the plurality of second height adjusting structures 106, the first die 104 and the second die 146 such that only one first exposed surface 112 of each of the plurality of first height adjusting structures 114 and one second exposed surface 116 of each of the plurality of second height adjusting structures 106 may be exposed for subsequent connection.

Each of the plurality of second solder balls 132 or the fifth solder balls 138 may include a material selected from a group consisting of Cu, Sn, SnPb, polymer for example. Each of the plurality of second solder balls 132 or the fifth solder balls 138 may include a diameter in a range of between about 0.1 mm to about 0.3 mm, for example about 0.2 mm. Each of the plurality of second solder balls 132 or the fifth solder balls 138 may include a shape selected from a group consisting of circle, shape, trapezium, for example. Each of the plurality of second solder balls 132 or the fifth solder balls 138 may be of the same or different material or dimension.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die package, comprising:
   at least one first height adjusting structure, the at least one first height adjusting structure comprising a first adjusting height relative to a common plane;
   at least one second height adjusting structure positioned adjacent to the at least one first height adjusting structure, the at least one second height adjusting structure comprising a second adjusting height relative to the common plane, wherein the second adjusting height is different from the first adjusting height relative to the common plane;
   a first die positioned on the at least one first height adjusting structure;
   a second die positioned between the first die and the at least one second height adjusting structure; and a mold housing substantially surrounding the at least one first height adjusting structure, the at least one second height adjusting structure and the first die.

2. The die package of claim 1,
   wherein the at least one first adjusting height differs from the at least one second adjusting height such that the first die is spaced apart from the at least one second height adjusting structure when the first die overlaps with the at least one second height adjusting structure.

3. The die package of claim 1,
   wherein the first adjusting height comprises a value higher than the second adjusting height.

4. The die package of claim 1,
   wherein the at least one first height adjusting structure comprises:
      a first metallic pad;
      a core portion disposed over the first metallic pad; and
      a second metallic pad disposed over the core portion.

5. The die package of claim 1,
   wherein the at least one first height adjusting structure comprises the same or different structure composition as the at least one second height adjusting structure.

6. The die package of claim 1,
   wherein the first die comprises a first front surface and a first back surface.

7. The die package of claim 6,
   wherein the first back surface of the first die is in contact with the at least one first height adjusting structure.

8. The die package of claim 7,
   wherein the first front surface of the first die is coupled to the at least one second height adjusting structure via at least one wire bond.

9. The die package of claim 7,
   wherein the first back surface of the first die is further coupled to the at least one second height adjusting structure via at least one first solder ball.

10. The die package of claim 1,
    wherein the second die comprises a second front surface and a second back surface.

11. The die package of claim 10, further comprising
    a second conductive back metal layer disposed on the second back surface of the second die.

12. The die package of claim 11,
    wherein the first back surface of the first die is coupled to the at least one first height adjusting structure via at least one second solder ball.

13. The die package of claim 12,
    wherein the first back surface of the first die is further coupled to the second conductive back metal layer via at least one third solder ball.

14. The die package of claim 13,
    wherein the second front surface of the second die is coupled to the at least one second height adjusting structure via at least one fourth solder ball.

15. The die package of claim 11, further comprising
a first conductive back metal layer disposed on the first back surface of the first die.

16. The die package of claim 15,
wherein the first conductive back metal layer is in contact with the at least one first height adjusting structure.

17. The die package of claim 16, further comprising
a second front layer disposed on a portion of the second front surface of the second die.

18. The die package of claim 17,
wherein the first conductive back metal layer is in contact with the second front layer.

19. The die package of claim 16,
wherein the first conductive back metal layer is further in contact with the second front surface of the second die.

20. The die package of claim 11,
wherein the first back surface of the first die is in direct contact with the second front surface of the second die.

21. The die package of claim 20,
wherein the second back surface of the second die is coupled to the at least one second height adjusting structure via at least one fifth solder ball.

22. The die package of claim 11,
wherein the second conductive back metal layer is in contact with the at least one second height adjusting structure.

23. The die package of claim 10,
wherein the first front surface of the first die is coupled to the second front surface of the second die via at least one wire bond.

24. The die package of claim 1,
wherein the at least one first height adjusting structure is spaced apart from the at least one second height adjusting structure by a distance in a range of 0.3 mm to 0.6 mm.

* * * * *